(12) United States Patent
Loechelt

(10) Patent No.: US 6,764,918 B2
(45) Date of Patent: Jul. 20, 2004

(54) STRUCTURE AND METHOD OF MAKING A HIGH PERFORMANCE SEMICONDUCTOR DEVICE HAVING A NARROW DOPING PROFILE

(75) Inventor: Gary H. Loechelt, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/307,590

(22) Filed: Dec. 2, 2002

(65) Prior Publication Data

US 2004/0106264 A1 Jun. 3, 2004

(51) Int. Cl.[7] .............................................. H01L 21/76
(52) U.S. Cl. .................. 438/416; 438/312; 438/309; 438/375; 438/349; 438/322; 438/367; 438/329; 257/566; 257/474; 257/478; 257/593; 257/197
(58) Field of Search ................................ 438/416, 312, 438/309, 375, 349, 322, 367, 329; 257/566, 474, 478, 593, 197

(56) References Cited

U.S. PATENT DOCUMENTS

| | | | |
|---|---|---|---|
| 5,389,562 A | * | 2/1995 | Mohammad ................ 704/243 |
| 6,362,065 B1 | | 3/2002 | Swanson et al. |
| 6,387,768 B1 | * | 5/2002 | Sakamoto .................... 438/367 |
| 6,506,659 B2 | * | 1/2003 | Zampardi et al. ........... 438/375 |
| 2002/0094658 A1 | * | 7/2002 | Swanson et al. ............ 438/416 |
| 2002/0132435 A1 | * | 9/2002 | Zampardi et al. ........... 438/312 |
| 2003/0094673 A1 | * | 5/2003 | Dunn et al. ................. 257/566 |

OTHER PUBLICATIONS

"Complete Suppression of Boron Transient–enhanced Diffusion and Oxidation–enhanced Diffusion in Silicon Using Localized Substitutional Carbon Incorpation", M.S. Carroll et al, 1998 American Institute of Physics, Applied Physics, Applied Physics Letters, vol. 73, No. 25, 21 Dec. 1998, pp. 3695–3697.

* cited by examiner

*Primary Examiner*—Caridad Everhart
*Assistant Examiner*—Victor V Yevsikov

(57) ABSTRACT

A structure and method of making an NPN heterojunction bipolar transistor (100) includes a semiconductor substrate (11) with a first region (82) containing a dopant (86) for forming a base region of the transistor. A second region (84) adjacent to the first region is used to form an emitter region of the transistor. An interstitial trapping material (81) reduces diffusion of dopants in the base region during subsequent thermal processing.

23 Claims, 4 Drawing Sheets

STRUCTURE AND METHOD OF MAKING A HIGH PERFORMANCE SEMICONDUCTOR DEVICE HAVING A NARROW DOPING PROFILE

FIELD OF THE INVENTION

This invention relates in general to semiconductor devices, and more particularly, to high frequency NPN heterojunction bipolar transistors and a method of fabricating such devices.

BACKGROUND OF THE INVENTION

NPN heterojunction bipolar transistors (HBT) are used in many different electronic applications, including integrated circuits and discrete components. An HBT has superior high frequency characteristics in that its frequency of unity current gain $f_\tau$ is higher than that for a homojunction bipolar transistor. An NPN HBT is also faster than a PNP HBT because the mobility of electrons in NPN devices is higher than the mobility of holes in PNP devices. Because of these reasons, an NPN HBT is ideally suited for high speed switching applications. In many instances, the $f_\tau$ of an NPN HBT is 100 GHz or higher.

As an example, an NPN HBT can include a silicon substrate and a silicon germanium layer contacting the silicon substrate. The interface between the silicon substrate and the silicon germanium layer is the heterojunction. The bandgap of silicon can be altered by varying the ratio of germanium to silicon in the heterostructure, producing very high speed bipolar transistors.

Many attempts in further improving NPN HBT performance have focused on decreasing the width of the base region because a narrow base is required for high switching speeds. However, accomplishing such a decrease has proved difficult for a variety of technical reasons.

For example, a limiting factor in making NPN transistors having narrow base widths is the diffusion of the boron dopant atoms in the base region during subsequent thermal process cycles, such as those encountered when forming dielectric layers like thermal oxide over the heterostructure containing the base region. Even though thermal oxide is an ideal passivation layer for silicon because it creates an interface with a low density of surface states and minimal defects, thermal oxidation also aggravates the problem of maintaining a narrow base because the oxidation reaction injects silicon interstitials from the surface into the semiconductor bulk which accelerates the diffusion of certain elements in a phenomena referred to as oxidation enhanced diffusion (OED). In particular, since boron diffuses primarily via an interstitial mechanism, OED significantly enhances the diffusion process, resulting in an undesirable spreading of the doping layer in the base, thereby increasing the base width. As is well known in the art, the frequency of unity current gain is approximately inversely proportional to the square of the base width. Therefore, in conventional NPN heterojunction bipolar transistor structures and methods, there is a limitation as to how thin the base epitaxy can be fabricated when subsequent thermal oxidation is performed.

Accordingly, a need exists for a structure and method of making a high performance NPN heterojunction bipolar transistor having a narrow base doping profile in which the method produces a device having superior high frequency performance.

DETAILED DESCRIPTION OF THE DRAWINGS

In the figures, elements having the same reference number have similar functionality. Note that a number of specific processing steps utilized to form the structures shown in the figures are omitted in order to simplify the description and better explain the invention. Many of these steps are described in detail in U.S. Pat. No. 6,387,768, entitled "Method of Manufacturing a Semiconductor Component and Semiconductor Component Thereof", issued on May 14, 2002, to Kurt Sakamoto, inventor.

Figure 1:
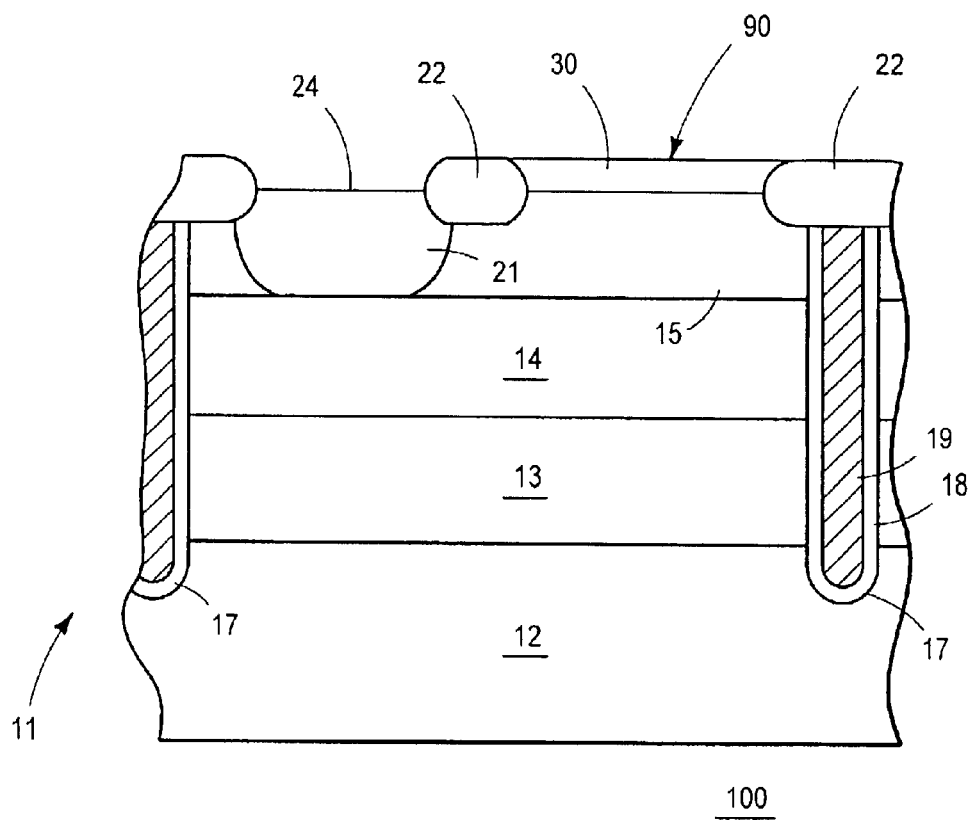
FIG. 1 is a cross-sectional view of an NPN heterojunction bipolar transistor or semiconductor device after a first fabrication stage.

FIG. 1 is a cross-sectional view of an NPN heterojunction bipolar transistor or semiconductor device 100 after a first stage of fabrication. NPN heterojunction bipolar transistor 100 is formed on a semiconductor substrate 11 and isolated from other devices (not shown), by a plurality of trenches 17. In one embodiment, substrate 11 is formed with monocrystalline silicon.

A base layer 12 is heavily doped to provide a low resistance ground plane for high frequency signals flowing through semiconductor device 100. In one embodiment, base layer 12 comprises monocrystalline silicon doped to have a p-type conductivity and a resistivity of about 0.1 ohm-centimeters.

An epitaxial layer 13 is grown on base layer 12 to have a p-type conductivity and a relatively high resistivity. The high resistivity provides a low parasitic substrate capacitance for semiconductor device 100, which increases the overall frequency response of semiconductor device 100. In one embodiment, epitaxial layer 13 has a thickness of about 2.75 micrometers and a doping concentration of about $1.0*10^{14}$ atoms/centimeter$^3$.

A buried layer 14 is formed over epitaxial layer 13 to provide a low collector resistance for semiconductor device 100. In one embodiment, buried layer 14 is implanted to have an n-type conductivity, a thickness of about one micrometer and a doping concentration of about $6.0*10^{19}$ atoms/centimeter$^3$.

An epitaxial layer 15 is grown over buried layer 14 to a thickness of about 0.8 micrometers. In one embodiment, epitaxial layer 15 has an n-type conductivity and a doping concentration of $2.0*10^{16}$ atoms/centimeter$^3$, approximately.

A plurality of trenches 17 are etched to a depth sufficient to reach base layer 12 in order to form electrically isolated islands that enclose portions of epitaxial layers 13 and 15 and buried layer 14. In one embodiment, trenches 17 are formed to a depth of about six Micrometers. Surfaces of trenches 17 are lined with a dielectric layer 18 and then filled with a conformal material 19. In one embodiment, dielectric layer 18 is thermally grown silicon dioxide, and conformal material 19 includes undoped polycrystalline silicon.

Surface 24 is patterned and a dielectric material is selectively formed on a surface 24 to produce shallow local isolation regions 22. In one embodiment, isolation regions 22 are formed with a thermally grown silicon dioxide.

Surface 24 is further patterned to mask dopants introduced into epitaxial layer 15 to form doped region 21, which diffuse during subsequent thermal cycles to extend into buried layer 14. Doped region 21 forms part of the collector of NPN heterojunction bipolar transistor 100. Regions 21 typically are heavily doped to provide low resistance paths from surface 24 to buried layer 14. In one embodiment, doped region 21 is formed with an n-type conductivity and an effective doping concentration on the order of about $2.0*10^{18}$ atoms/centimeter$^3$.

Figure 2:
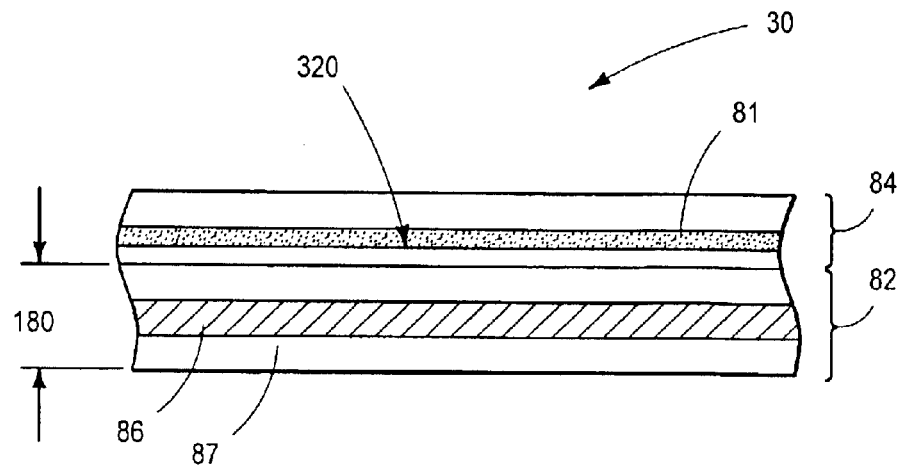
FIG. 2 is a detailed cross-sectional view of heterojunction epitaxial stack 30 of FIG. 1.

FIG. 2 is a detailed cross-sectional view of heterojunction epitaxial stack 30 of FIG. 1. The heterojunction epitaxial stack 30 contains an interstitial trapping material or region 81 formed over surface 24. Heterojunction epitaxial stack 30 comprises a second region or silicon (Si) cap 84 formed over a first region or silicon germanium (SiGe) layer 82. This second region or semiconductor layer 84 will eventually comprise an emitter, and the first region or semiconductor layer 82 will eventually comprise a base of the bipolar transistor after later fabrication stages. The boundary between regions 82 and 84 marks the location of the emitter-base junction in the device.

In one embodiment, Si cap 84 is formed having a thickness of about 200–500 angstroms, and semiconductor or SiGe layer 82 is formed to a thickness of about 300–1000 angstroms and having a germanium concentration of about 8–20%. Thus, the thickness of heterojunction epitaxial stack 30 in the above embodiment is about 500–1500 angstroms. Furthermore, the germanium profile (not shown) in the SiGe layer 82 may be flat or graded in a number of different ways in order to meet various device performance objectives. Additionally, SiGe layer 82 also includes a first dopant or p-type doped region 86. In one embodiment, the p-type doped region 86 is a boron doped layer with a thickness of about 100–200 angstroms and a concentration of about $2.0*10^{19}$ atoms/centimeter$^3$. The Si cap 84 includes the interstitial trapping material or region 81. In one embodiment, the interstitial trapping material or region 81 is formed with a thickness of about 100–200 angstroms and has a carbon concentration of about 0.1–0.2%, or about $5.0*10^{19}$–$1.0*10^{20}$ atoms/centimeter$^3$. In the embodiment depicted in FIG. 2, the boron doped region 86 is physically separated from the interstitial trapping material or region 81 by about 200–800 angstroms of undoped or lightly doped Si and/or SiGe. Alternatively, the carbon of the interstitial trapping region 81 may extend into the SiGe layer or base region 82, and/or have a second and distinctly separate carbon region 87 contained within the SiGe layer or base region 82. The above various embodiments of heterojunction epitaxial stack 30 all have a substantial amount of carbon present outside the SiGe layer or base region 82 of the transistor in the emitter region 84 of the device.

Heterojunction epitaxial stack 30 can be formed using a standard selective epitaxial process in which monocrystalline silicon containing silicon germanium and boron is formed in a first region or SiGe layer 82, using low pressure selective epitaxy. Then, by shutting off the germanium and boron material sources, and turning on a carbon source, the second region or Si cap 84 is formed of monocrystalline silicon including carbon.

In the alternative embodiment where there is a second and distinctly separate carbon region 87 contained within the SiGe layer 82, carbon is introduced into the SiGe layer 82 in a second region 87 at the beginning of the formation of SiGe layer 82 in order to provide a region 87 of interstitial trapping material, in a similar fashion as above, in order to prevent downward spreading of the boron into the collector, which would increase the base width and degrade the electrical performance of the device.

Figure 3:
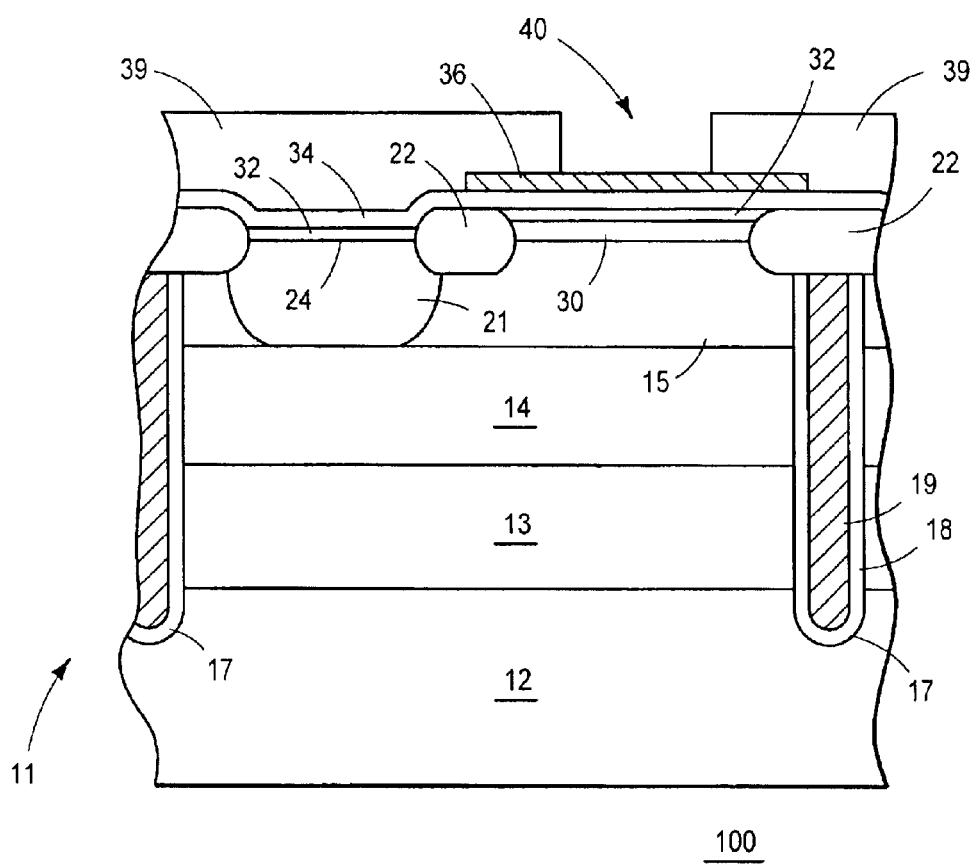
FIG. 3 is a cross-sectional view of the NPN heterojunction bipolar transistor after a second fabrication stage.

FIG. 3 is a cross-sectional view of semiconductor device 100 after a second stage of fabrication.

A dielectric material is selectively formed on surface 24 to produce a dielectric material 32. In one embodiment, dielectric material 32 comprises a thermally grown silicon dioxide layer formed with a typical thickness of about one hundred angstroms.

Formation of dielectric material 32 on surface 90 of heterojunction epitaxial stack 30 introduces silicon interstitials 320 into the heterojunction epitaxial stack 30 and in some cases substrate 11. However, the presence of the interstitial trapping material 81 effectively limits interstitial atoms from reaching the boron doped layer or region 86, thereby maintaining a narrower base width 180 than is possible without the interstitial trapping material 81. The base of a bipolar transistor is the region that controls the current switching capabilities of the device. Since the transit time of injected minority carriers through the base is approximately proportional to the square of the base width, reducing the base width dramatically decreases the base transit time, which is inversely related to the frequency of unity current gain $f_r$. Consequently, bipolar transistors with narrower bases can switch current at higher frequencies.

A dielectric material is then deposited over dielectric material 32 to produce a dielectric film 34. In one embodiment, dielectric film 34 comprises a deposited silicon nitride formed to a thickness of about one thousand angstroms.

A conductive film is formed over dielectric film 34 and patterned to produce an NPN base electrode 36. In one embodiment, base electrode 36 comprise polycrystalline silicon formed to a thickness of about one thousand eight hundred angstroms and heavily doped to provide a p-type conductivity.

A dielectric material is then deposited on semiconductor device 100 to produce a dielectric film 39. In one embodiment, dielectric film 39 comprises silicon dioxide deposited to a thickness of about one micrometer and subjected to a planarization etchback to leave a final thickness of about six thousand angstroms.

Dielectric film 39 is patterned and etched to produce an opening 40 that exposes base electrode 36.

Figure 4:
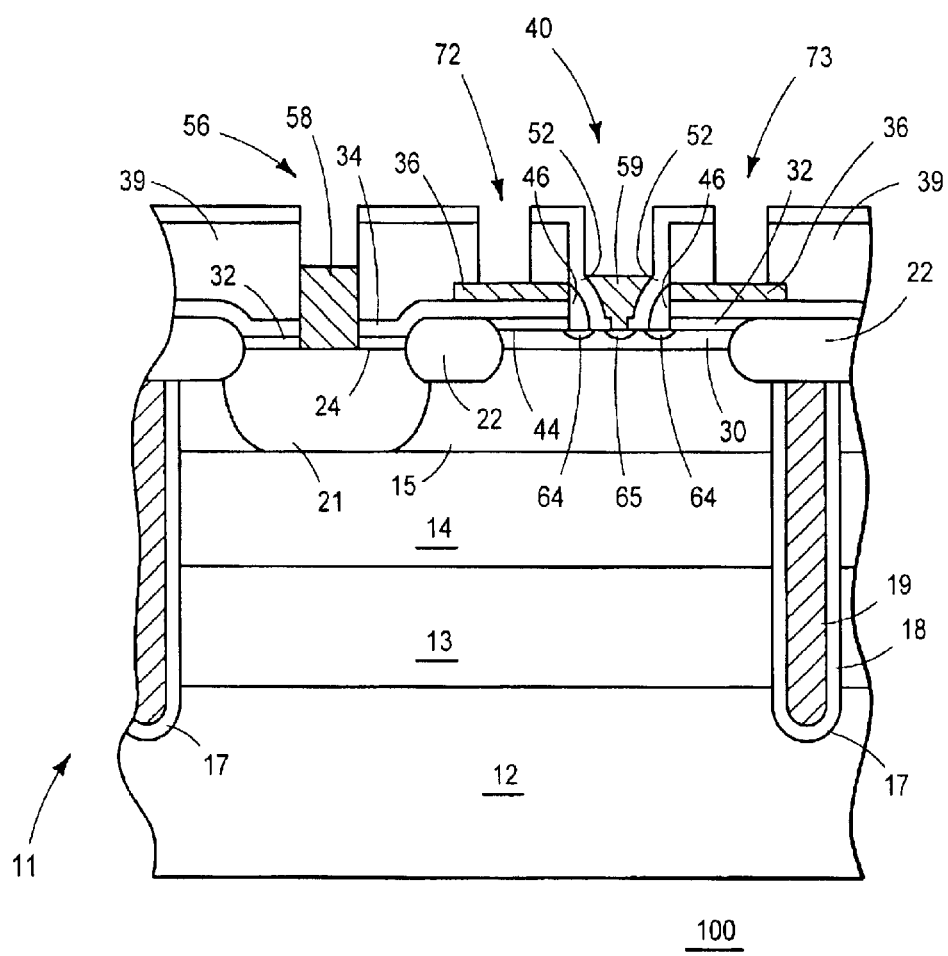
FIG. 4 is a cross-sectional view of the NPN heterojunction bipolar transistor after a third fabrication stage.

FIG. 4 shows a cross-sectional view of semiconductor device 100 after a third stage of fabrication.

A sequence of standard etch steps removes material from portions of dielectric material 32 and 34 where to expose base electrode 36 in opening 40. The result of these etching steps is to expose a surface 44 of heterojunction epitaxial stack 30 through opening 40. Opening 40 thereby defines a contact window in base electrode 36.

A conductive material is deposited on exposed surfaces of semiconductor device 100 and anisotropically etched to produce conductive spacers 46 along sidewalls of opening 40. Spacers 46 are overetched so that their height extends from surface 44 to electrically contact base electrode 36. Such overetching reduces parasitic electrode capacitances and also avoids device failures due to electrode shorting from film thinning over the vertical steps formed at the upper corners of opening 40.

A dielectric material and a sequence of other films are deposited and selectively etched to form dielectric spacers 52 in NPN heterojunction bipolar transistor 100 as shown. In one embodiment, spacers 52 comprise silicon nitride deposited to a thickness of about one thousand angstroms.

Semiconductor device 100 is then patterned and etched to form an NPN collector window 56 for contacting epitaxial layer 15. A semiconductor material is deposited and a planarization etchback or similar process removes portions of the semiconductor material. For NPN transistor 100, the etchback leaves a first portion of the semiconductor material within window 56 as an NPN collector electrode 58 and a second portion within opening 40 as a third region or NPN emitter electrode 59. In one embodiment, the semiconductor material comprises polycrystalline silicon heavily doped to provide an n-type conductivity and a low resistance. In one embodiment, the emitter electrode includes the dopant arsenic.

Figure 5:
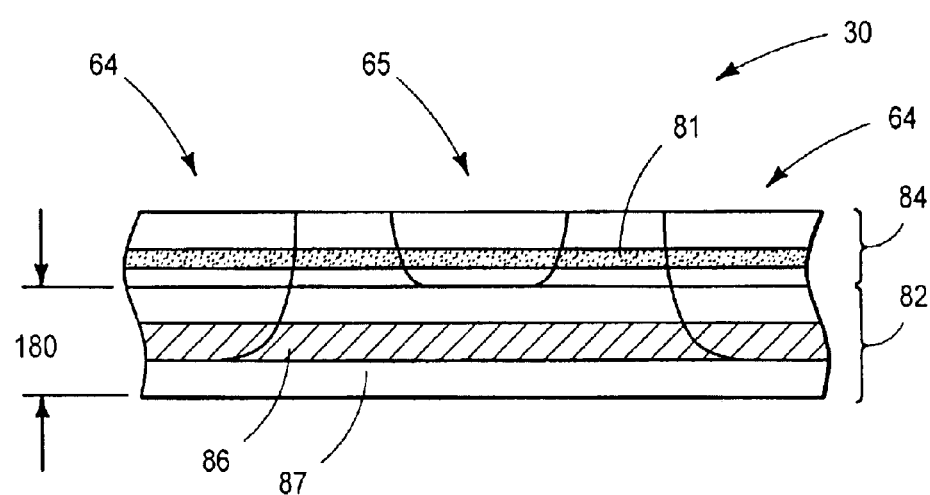
FIG. 5 is a detailed cross-sectional view of heterojunction epitaxial stack 30 of FIG. 4.

FIG. 5 is a detailed cross-sectional view of heterojunction epitaxial stack 30 of FIG. 4. A subsequent thermal cycle results in the outdiffusion of dopants from the conductive and semiconductor materials contacting surfaces 24 and 44. In particular, for semiconductor device 100, p-type dopants from spacers 46 diffuse through surface 44 into base region 82 to form p-type NPN base contact regions 64, and n-type dopants diffuse from emitter electrode 59 to form an n-type emitter contact region 65 as shown. Base contact regions 64 and emitter contact region 65 typically are formed to a depth of less than 0.1 micrometers below surface 44.

A photoresist step patterns semiconductor device 100 and exposed films are selectively etched to produce openings 72–73 for electrically contacting NPN base electrode 36. Subsequent interconnect metallization layers, interlayer dielectric films, passivation films and the like are applied in a standard fashion and are not specifically illustrated in order to simplify the description and more clearly describe the invention.

One advantage of the above structures is that by incorporating carbon into Si cap layer or emitter region 84, the carbon traps the interstitials 320 injected from the surface 90 into the heterojunction epitaxial stack 30 during the growth of dielectric material or thermal oxide 32. Interstitial silicon is known to enhance the diffusion of several dopant elements, particularly boron. Since the diffusion length of silicon interstitials is several micrometers, they can easily reach a boron doped region such as 86 and accelerate the diffusion of the dopant atoms, resulting in undesirable broadening of the base region of the transistor. By trapping these interstitials injected during the formation of dielectric material or thermal oxide 32, the oxidation enhanced diffusion effect (whereby boron diffusion is greatly increased) is minimized or eliminated altogether. Thus, by trapping the silicon interstitials 320 with the interstitial trapping region 81, the width 180 of base region 82 can be made smaller and remain narrow even if subjected to subsequent thermal processing like thermal oxidation. Dimensional control is improved by a factor of two to five resulting in the ability to utilize base regions having smaller widths as well as enabling the base to be more closely located to the emitter, which further improves the electrical performance of the finished transistor. In particular, smaller base widths allow transistors to be formed having reduced base transit times and more abrupt emitter-base junctions, both of which improve its high speed switching capabilities.

Additionally, the above structures with an interstitial trapping layer 81 contained within the emitter region 84 of the device solves the problem, of the interstitial trapping element degrading the electrical performance of the device. Carbon can potentially degrade the electrical properties of a semiconductor material by reducing carrier lifetimes and mobilities. This problem can be especially severe in the base region 82 of the transistor where a reduction in carrier lifetimes results in higher base current and lower DC current gain, and a reduction in mobility increases the base transit time of the device. In the above structures, however, a significant amount of carbon is located outside the base region 82 in the emitter region 84 of the device. Most modern, high-performance NPN transistors have heavily doped, degenerate emitters. Since the high doping concentration in the emitter region already causes a significant decrease in carrier lifetimes through both Shockley-Read-Hall and Auger recombination, and in carrier mobility through ionized impurity scattering, any further reduction in these electrical properties which might be caused by the presence of carbon is insignificant. As an illustration, consider the fact that a carbon concentration of 0.1–0.2%, or about $5.0*10^{19}$–$1.0*10^{20}$ atoms/centimeter$^3$, exceeds the boron doping concentration of the base ($2.0*10^{19}$ atoms/centimeter$^3$) but is still less than the $5.0*10^{20}$–$1.0*10^{21}$ atoms/centimeter$^3$ doping concentration typical of most emitters. Consequently, the beneficial diffusion reducing properties of carbon can be utilized without incurring its detrimental electrical side-effects. By locating the interstitial trapping region 81 between the boron doped region 86 of the base of the NPN transistor and the oxidation layer 32 prior to the formation of an emitter contact 65, any undesirable effects of the interstitial trapping material is moved to a non-critical region of the device structure.

In contrast to PNP HBT devices, in which the control of dopant diffusion from the emitter to the base is a primary concern, the above solution enables the trapping of interstitials from oxidation processes subsequent to the base formation. If allowed to propagate into the base region, these interstitials would enhance the boron diffusion and consequently enlarge the base width.

The simple method described above is compatible with standard semiconductor processing, and results in a low cost, high speed NPN heterojunction bipolar transistor having a precisely controlled base width.

SUMMARY OF THE INVENTION

In summary, the present invention provides a structure and method of making an NPN heterojunction bipolar transistor 100, wherein the NPN heterojunction bipolar transistor comprises a semiconductor substrate 11 having a first region 82 containing a first dopant 86 for forming a base region of the transistor and a second region 84 adjacent to the first region for forming an emitter region of the transistor and comprising an interstitial trapping material 81 that reduces diffusion of dopants in the base region during subsequent thermal processing.

What is claimed is:

1. A high speed NPN heterojunction bipolar transistor, comprising:
    a semiconductor substrate having a first region containing a p-type dopant for forming a base region of the transistor; and
    a second region containing an n-type dopant forming an emitter region of the transistor adjacent to and over the first region, wherein the second region includes an interstitial trapping material.

2. The high speed NPN heterojunction bipolar transistor of claim 1, further including a dielectric material formed on the semiconductor substrate.

3. The high speed NPN heterojunction bipolar transistor of claim 2, wherein the dielectric material includes thermally grown silicon dioxide.

4. The high speed NPN heterojunction bipolar transistor of claim 2, wherein the first region is separated from the dielectric material by the second region.

5. The high speed NPN heterojunction bipolar transistor of claim 1, wherein the interstitial trapping material includes carbon.

6. The high speed NPN heterojunction bipolar transistor of claim 1, wherein the p-type dopant includes boron.

7. The high speed NPN heterojunction bipolar transistor of claim 1, wherein the first region includes silicon germanium.

8. The high speed NPN heterojunction bipolar transistor of claim 1, wherein the second region has a second dopant for forming an emitter region of the transistor.

9. The high speed NPN heterojunction bipolar transistor of claim 1, wherein the n-type dopant includes arsenic.

10. The high speed NPN heterojunction bipolar transistor of claim 1, wherein the first region includes interstitial trapping material.

11. A high speed NPN heterojunction bipolar transistor, comprising:

a semiconductor substrate having a surface formed with a dielectric material;

a first semiconductor layer having a n-type dopant formed adjacent to and under the dielectric material and including an interstitial trapping material; and a second semiconductor layer having a p-type dopant to form a base region of the high speed NPN heterojunction bipolar transistor.

12. The high speed NPN heterojunction bipolar transistor of claim 11, wherein the first semiconductor layer is formed over and adjacent to the second semiconductor layer.

13. The high speed NPN heterojunction bipolar transistor of claim 11 wherein the p-type dopant includes boron.

14. The high speed NPN heterojunction bipolar transistor of claim 11, wherein the interstitial trapping material includes carbon.

15. A method of forming a high speed NPN heterojunction bipolar transistor, comprising:

providing a semiconductor substrate having a first region formed containing a p-type dopant for forming a base region of the transistor and a second region formed adjacent to and over the first region and comprising an interstitial trapping material.

16. The method of claim 15, further including the step of forming a dielectric material on the semiconductor substrate.

17. The method of claim 16, wherein the first region is separated from the dielectric material by the second region.

18. The method of claim 16, wherein the interstitial trapping material comprises carbon.

19. The method of claim 17, wherein the second region contains a n-type dopant to form an emitter electrode of the transistor.

20. The method of claim 19, wherein the n-type dopant includes arsenic.

21. The method of claim 15, wherein the first p-type dopant includes boron.

22. The method of claim 15, wherein the first region includes silicon germanium.

23. The method of claim 15, wherein the first region includes interstitial trapping material.

* * * * *